United States Patent
Joo et al.

(10) Patent No.: US 6,204,122 B1
(45) Date of Patent: Mar. 20, 2001

(54) METHODS OF FORMING NONVOLATILE INTEGRATED CIRCUIT MEMORY DEVICES HAVING HIGH CAPACITIVE COUPLING RATIOS

(75) Inventors: Kyung-joong Joo, Kyungki-do; Jeong-hyuk Choi, Seoul; Wang-chul Shin, Kyungki-do, all of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 08/932,641

(22) Filed: Sep. 17, 1997

(30) Foreign Application Priority Data

Oct. 5, 1996 (KR) .................................. 96-44130

(51) Int. Cl.$^7$ .................. H01L 21/336; H01L 21/3206; H01L 21/4763
(52) U.S. Cl. .................. 438/257; 438/267; 438/265; 438/594
(58) Field of Search ................. 438/267, 597, 438/265, 257, 259, 593, 594, 260

(56) References Cited

U.S. PATENT DOCUMENTS

| | | | |
|---|---|---|---|
| 5,057,446 | 10/1991 | Gill et al. | 437/43 |
| 5,267,194 | 11/1993 | Jang | 365/185 |
| 5,420,060 | 5/1995 | Gill et al. | 437/52 |
| 5,422,504 | 6/1995 | Chang et al. | 257/316 |
| 5,432,112 * | 7/1995 | Hong | 437/43 |
| 5,494,838 | 2/1996 | Chang et al. | 437/43 |
| 5,501,996 | 3/1996 | Yang et al. | 437/43 |
| 5,512,505 | 4/1996 | Yuan et al. | 437/43 |
| 5,514,607 | 5/1996 | Taneda | 437/43 |
| 5,516,713 | 5/1996 | Hsue et al. | 437/43 |
| 5,543,339 * | 8/1996 | Roth et al. | 438/265 |
| 5,569,945 | 10/1996 | Hong | 257/316 |
| 5,585,656 | 12/1996 | Hsue et al. | 258/321 |
| 5,618,742 | 4/1997 | Shone et al. | 438/263 |
| 5,650,345 | 7/1997 | Ogura et al. | 437/43 |
| 5,665,620 * | 9/1997 | Nguyen et al. | 438/593 |

FOREIGN PATENT DOCUMENTS 3-34578  2/1992 (JP).

OTHER PUBLICATIONS

PTO Document 00–0464 Translation of Kokai 03–034578A, Nov. 1999.*
S. Wolf and R.N. Tauber, Silicon Processing for the VLSI Era, vol. 1, Lattice Press, pp. 175–182, 384–386, and 540–542, 1986.*

* cited by examiner

Primary Examiner—Olik Chaudhuri
Assistant Examiner—Howard Weiss
(74) Attorney, Agent, or Firm—Myers Bigel Sibley & Sajovec (57) ABSTRACT

Methods of forming nonvolatile integrated circuit memory devices having high capacitive coupling ratios include the steps of forming a tunneling oxide layer on a face of a semiconductor substrate and then forming a forming a first conductive layer (e.g., doped polysilicon) on the tunneling oxide layer. A floating gate electrode mask is then patterned on the first conductive layer so as to expose a portion the first conductive layer. A second conductive layer is then patterned on the exposed portion of the first conductive layer and on sidewalls of the floating gate electrode mask, to define a concave or U-shaped floating gate electrode having conductive sidewall extensions. The sidewall extensions increase the effective area of the floating gate electrode and increase the capacitance coupling ratio which enables programming and erasing at reduced voltage levels. A first electrically insulating layer is then formed on the U-shaped floating gate electrode, opposite the tunneling oxide layer. A control gate is then formed on the first electrically insulating layer, opposite the U-shaped floating gate electrode.

8 Claims, 11 Drawing Sheets

METHODS OF FORMING NONVOLATILE INTEGRATED CIRCUIT MEMORY DEVICES HAVING HIGH CAPACITIVE COUPLING RATIOS

FIELD OF THE INVENTION

The present invention relates to methods of forming integrated circuits and more particularly to methods of forming integrated circuit memory devices.

BACKGROUND OF THE INVENTION

Nonvolatile memory devices such as EEPROM or flash EEPROM devices typically have a floating gate in which data is retained and a control gate to which a control voltage is applied, on a semiconductor substrate having source and drain regions therein.

Figure 1A:
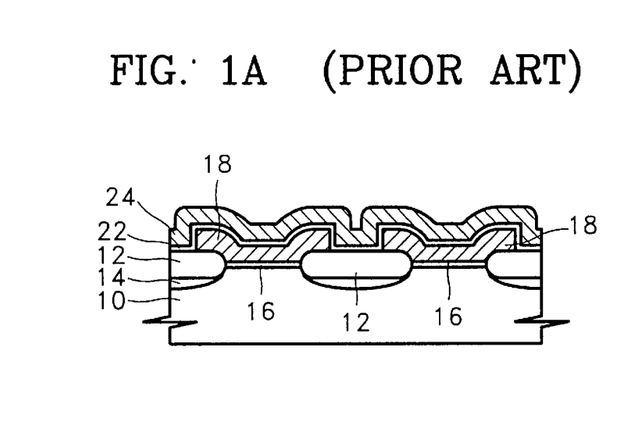
FIGS. 1A–1B are cross-sectional views of a prior art EEPROM device, taken along the word line and bit line direction, respectively.
Figure 1B:
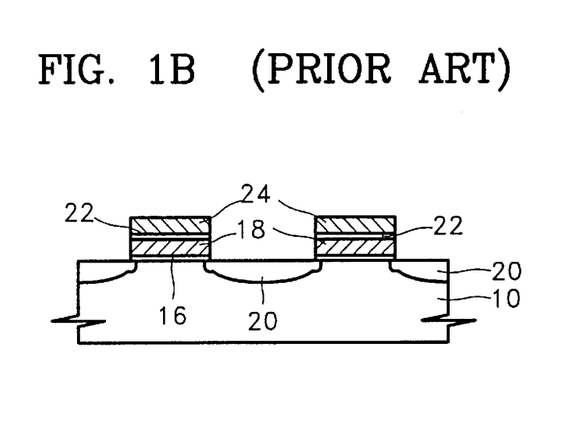

FIGS. 1A–1B are sectional views showing a conventional EEPROM device, in which FIG. 1A is a sectional view taken along a word line, and FIG. 1B is a sectional view taken along a bit line. Referring to FIGS. 1A–1B, a plurality of active regions and a plurality of field regions are sequentially disposed parallel to each other on a semiconductor substrate 10. A tunnel oxide layer 16 is formed on the active regions and an isolation layer 12 for isolating the active regions is formed on the field regions. A channel stop layer 14 for strengthening isolating characteristics is formed under the isolation layer 12, as illustrated. A rectangular floating gate 18 patterned to be extended to the edges of the isolation layer 12, is formed on the tunnel oxide layer 16, and an interlayer insulation film 22 of ONO (oxide/nitride/oxide) is formed on the floating gate 18. A control gate 24 is formed on the interlayer insulation film 22. Also, source and drain regions 20 are formed on the semiconductor substrate between the floating gates of adjacent unit cell transistors, as illustrated best by FIG. 1B.

Figure 2A:
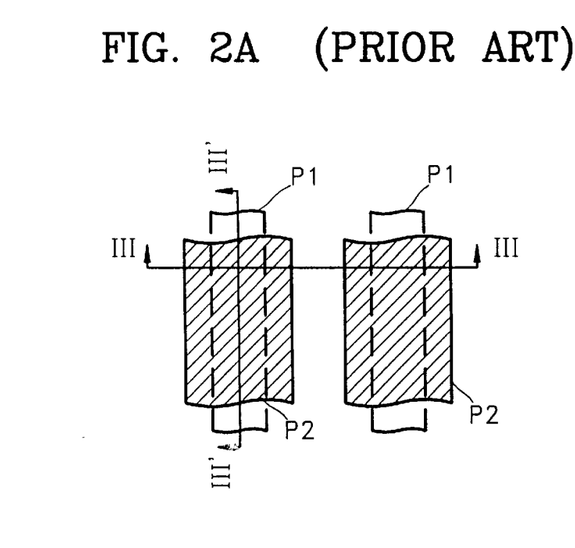
FIGS. 2A–2B are layout views of the EEPROM device of FIGS. 1A–1B.
Figure 2B:
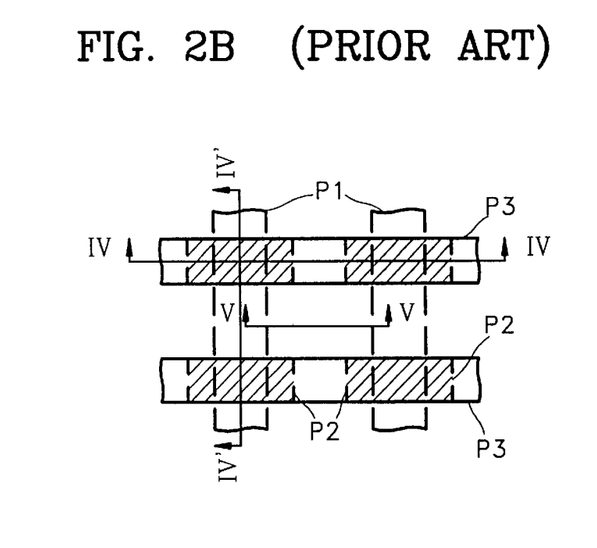

FIGS. 2A and 2B are layout views showing the sequence of steps in a conventional EEPROM manufacturing process. In FIG. 2A, the area indicated by a dashed line represents a first mask pattern P1 for forming the active region of a semiconductor substrate, and an oblique-lined area represents a second mask pattern P2 for forming a floating gate. In FIG. 2B, the area indicated by a solid line represents a third mask pattern P3 for forming a control gate.

As used herein, a direction along the line III—III of FIG. 2A is called a word line direction, and a direction along the line III'—III' is called a bit line direction. Also, the floating gate of the second mask pattern P2 is extended to the field region (the region between first mask patterns of adjacent unit cell transistors) as well as the active regions (the regions of the first mask patterns P1).

Figure 3A:
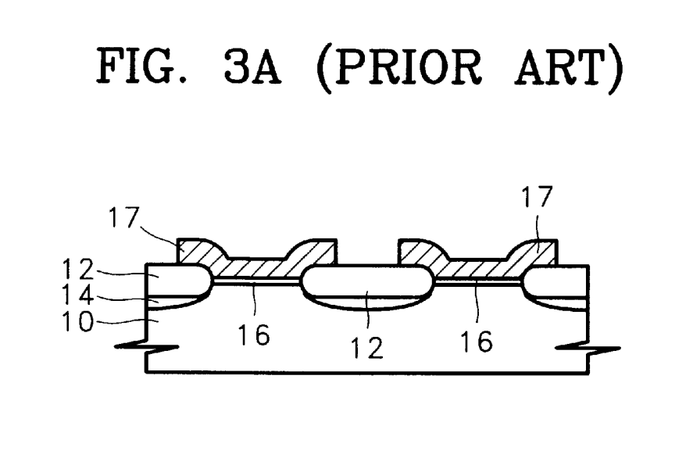
FIGS. 3A and 4A are cross-sectional views of intermediate structures that illustrate a conventional method of forming the EEPROM device of FIG. 1A.
Figure 3B:
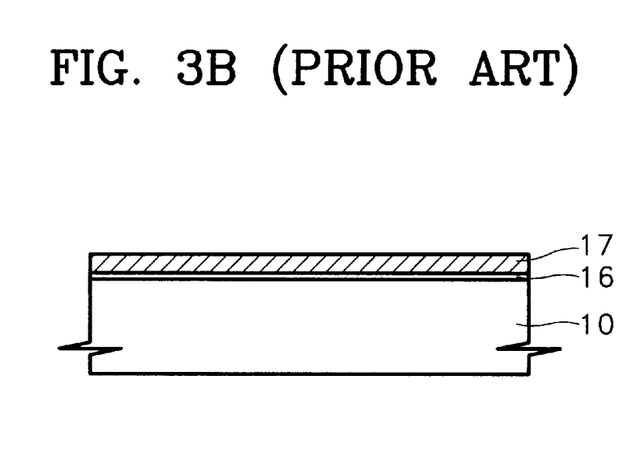
FIGS. 3B and 4B are cross-sectional views of intermediate structures that illustrate a conventional method of forming the EEPROM device of FIG. 1B.
Figure 4A:
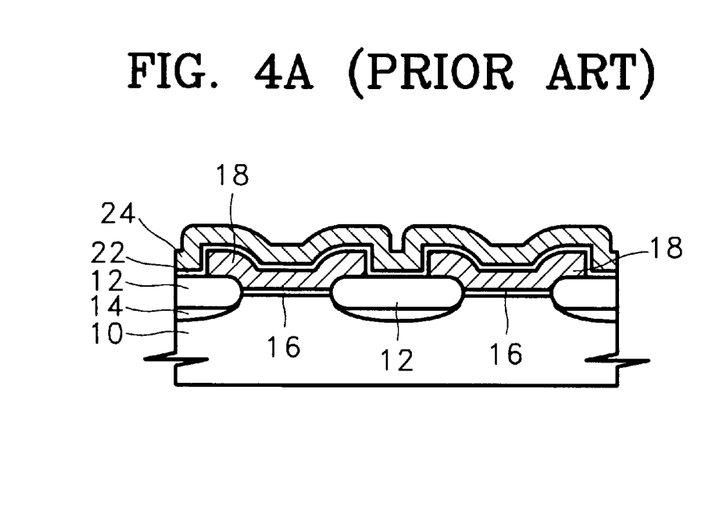
Figure 4B:
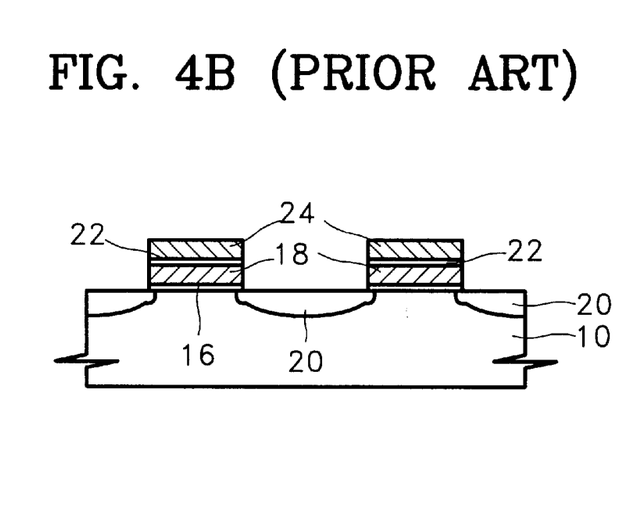

FIGS. 3A and 3B are sectional views taken along the lines III—III and III'—III' of FIG. 2A, and FIGS. 4A and 4B are sectional views taken along the lines IV—IV and IV'—IV' of FIG. 2B. First, referring to FIGS. 3A and 3B, an N-type well and a P-type well (not shown) are sequentially formed on a P-type semiconductor substrate 10. A channel stop layer 14 and an isolation film 12 are formed using a conventional isolation method such as a field ion implantation method, Local Oxidation of Silicon (LOCOS) or Selective Polysilicon Oxidation (SEPOX). Subsequently, a tunnel oxide layer 16 is formed on the active regions, polysilicon for a floating gate is deposited thereon using a conventional chemical vapor growth deposition (CVD) method, and then a floating gate pattern 17 is formed in a bit line direction during a photolithographic etching process using the second mask pattern P2 of FIG. 2A as an etching mask.

Next, referring to FIGS. 4A and 4B, an interlayer insulation film 22 consisting of ONO is formed on the entire surface of the floating gate pattern 17, and polysilicon and polycide for the control gate are sequentially deposited thereon. Then, the polysilicon and polycide for the control gate, interlayer insulation film 22 and floating gate pattern 17 are sequentially etched (by a self-alignment etching process), thereby forming a floating gate 18, an interlayer insulation film 22 formed on the floating gate 18, and a control gate 24 formed in a word line direction. The source and drain regions 20 may be formed by implanting impurity ions after forming the floating gate 18 and the control gate 24.

As will be understood by those skilled in the art, EEPROM devices may be programmed by causing the forward tunneling of electrons from a drain or a bulk region, (e.g., a semiconductor substrate) to a floating gate, and erased by causing the reverse tunneling of electrons from the floating gate to the drain or bulk region. The program and erase operations will now be described in detail with reference to FIG. 1. First, the program operation is performed to charge the floating gate 18 with electrons by applying a high voltage of about 18 volts to the control gate 24. During the programming operations, the drain 20 is grounded and the source 20 is floated. Next, the erase operation is performed by transferring the electrons accumulated in the floating gate 18 to the drain 20 or bulk region. Here, a high voltage of about 18 volts is applied to the drain 20, the control gate 24 is grounded, and the source 20 is floated so that electrons held by the floating gate 18 tunnel out to the drain 20. Alternatively, a high voltage of about 18 volts is applied to the bulk region and the control gate 24 is grounded so that electrons tunnel from the floating gate 18 to the bulk region.

During these operations, the voltage induced on the floating gate 18 is determined by a ratio of the capacitance between the floating gate 18 and control gate 24 to the capacitance between the floating gate 18 and semiconductor substrate 10. This capacitance ratio is called a coupling ratio.

As described above, since a high voltage is applied to the nonvolatile memory device during a program operation, isolation characteristics between active regions are important in determining device reliability. The factors which determine the isolation characteristics are the thickness and width of an isolation layer, the impurity concentration of a channel stop layer formed underneath the isolation layer, and the magnitude of the voltage supplied during the program operation. As the isolation spacing between active regions becomes narrower during device integration, these factors can become serious impediments to the ability to achieve high integration densities.

One of the methods for strengthening the device isolation characteristics is to thicken the isolation layer. However, as the degree of device integration is increased, the width of a field isolation region typically becomes smaller. Thus, increasing the thickness of an isolation layer to be grown in a reduced field region has a limited effect. As another method for strengthening device insulation characteristics, the impurity concentration of a device isolating channel stop layer may be increased. This method, however, has several disadvantages since the breakdown characteristics may be deteriorated at the points where the source/drain and a channel stop layer meet, and because the channel stop layer is typically extended into the cell active region by a subsequent thermal process to reduce the width of the cell active region, which lowers cell current.

Another method of strengthening the device isolation characteristics includes reducing the voltage applied to the control gate during programming operations and increasing the coupling ratio so that the voltage appearing between the floating gate and substrate is maintained at a high level to promote tunneling. This increase in coupling ratio also allows the voltage induced to both ends of the tunnel oxide layer to be kept constant. Thus, since a programmable cell is implemented at a lower program voltage, the thickness of the isolation layer can be reduced.

In order to increase the coupling ratio, there has been proposed a method for increasing the dielectric constant of the interlayer insulation film disposed between the floating gate and control gate; however, this requires a newly developed dielectric material. Alternatively, the thickness of the interlayer insulation film may be reduced. This method involves some limitation in scaling down, since the insulation characteristics between the control gate and floating gate must be maintained while performing program and erase operations.

Accordingly, attempts have been made to develop methods for increasing the coupling ratio by changing the structure of a memory cell to increase the capacitance between the floating gate and the control gate. In the conventional nonvolatile memory device, in order to increase the capacitance between the floating gate and control gate by changing the cell structure, the floating gate is extended up to the first isolation layer at both ends of the active region to increase the area of the upper portion of the floating gate which overlaps the control gate. Otherwise, the thickness of the floating gate is increased to increase the area of both sections of the floating gate surrounded by the control gate in the word line direction. However, these methods involve a limitation in reducing the spacing between the floating gates since the cell size is reduced in accordance with the high-integration of devices. Also, the increased thickness of the floating gate causes difficulties during an etching process for forming the floating gate pattern and a subsequent self-alignment etching process for forming the control gate and floating gate due to the increased aspect ratio between cells.

Figure 5A:
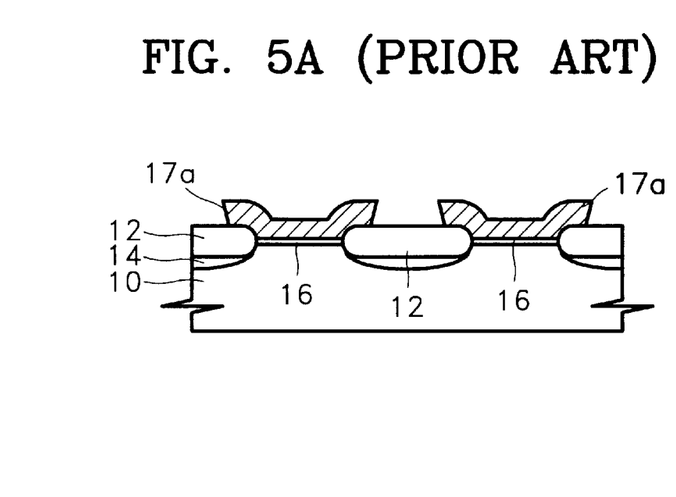
FIGS. 5A–5B are cross-sectional views of a prior art EEPROM device, taken along the word line and bit line direction, respectively.
Figure 5B:
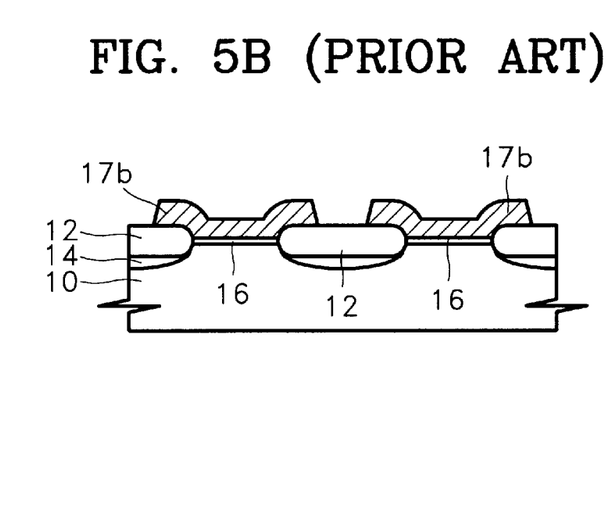
Figure 6:
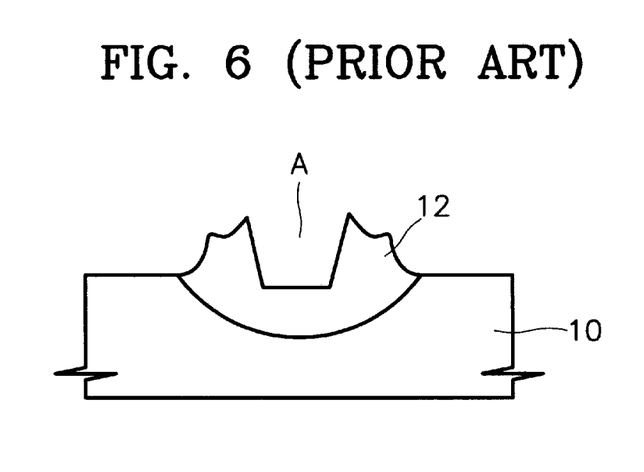
FIG. 6 is a cross-sectional view of a field oxide isolation region having a trench formed therein to eliminate residual defects.

FIGS. 5A and 5B are sectional views taken along the line IV—IV of FIG. 2B and FIG. 6 is a sectional view taken along the line V—V of FIG. 2B. These figures illustrate problems encountered when the floating gate is extended up to the isolation layer or the floating gate is thickened for increasing the capacitance between the floating gate and control gate. Referring to FIGS. 5A and 5B, since it is difficult to make the perfectly perpendicular profile during an etching process for forming a floating gate pattern, the profiles of the floating gate patterns 17a and 17b have slanting edges. Thus, during a self-alignment etching process for forming the control gate and floating gate, the ONO layer formed on the sides of the floating gate pattern is not completely removed during an anisotropic etching process, and polysilicon or polycide remaining underneath the unetched ONO layer, i.e., a material constituting the control gate or floating gate, is difficult to etch due to a shadowing effect which produces polysilicon or polycide residues. The residues cause two adjacent control gates to be shorted from each other to thereby cause a defective memory device. Therefore, as shown in FIG. 6, an overetch is performed to removed the residues. However, the thickness of the isolation layer 12 is decreased by the overetch which weakens the isolation characteristics between active regions.

SUMMARY OF THE INVENTION

It is therefore an object of the present invention to provide improved methods of forming integrated circuit memory devices.

It is another object of the present invention to provide methods of forming nonvolatile integrated circuit memory devices that can be programmed and erased using reduced voltage levels.

It is still another object of the present invention to provide methods of forming nonvolatile integrated circuit memory devices having high capacitance coupling ratios.

These and other objects, features and advantages of the present invention are provided by methods of forming nonvolatile memory devices that comprise the steps of forming a tunneling oxide layer on a face of a semiconductor substrate and then forming a first conductive layer (e.g., doped polysilicon) on the tunneling oxide layer. A floating gate electrode mask is then patterned on the first conductive layer so as to expose a portion the first conductive layer. A second conductive layer is then patterned on the exposed portion of the first conductive layer and on sidewalls of the floating gate electrode mask, to define a concave or U-shaped floating gate electrode having conductive sidewall extensions. These sidewall extensions increase the effective area of the floating gate electrode and increase the capacitance coupling ratio which enables programming and erasing at reduced voltage levels. A first electrically insulating layer is then formed as a capacitor dielectric layer on the U-shaped floating gate electrode, opposite the tunneling oxide layer. A control gate is then formed on the first electrically insulating layer, opposite the U-shaped floating gate electrode.

According to a preferred embodiment of the present invention, the step of forming a first conductive layer is preceded by the step of forming a field oxide isolation region on the substrate, and the step of forming a floating gate electrode mask comprises forming a nitride masking layer on the first conductive layer and then etching the nitride masking layer and the first conductive layer to expose the upper surface of the field oxide isolation region. The step of forming a first electrically insulating layer also preferably comprises forming a silicon dioxide layer and a silicon nitride layer on the U-shaped floating gate electrode and then thermally oxidizing the silicon nitride layer. The step of forming a first electrically insulating layer is also preferably preceded by the steps of depositing an oxide layer on the floating gate electrode mask and on the upper surface of the field oxide isolation region, etching the deposited oxide layer to define a buried insulating layer on the field oxide isolation region and expose an upper surface of the floating gate electrode mask and then wet etching the floating gate electrode mask to expose the U-shaped floating gate electrode, using the conductive sidewall extensions and the buried insulating layer as an etching mask. According to another embodiment of the present invention, the step of forming a floating gate electrode mask is preceded by the step of forming a first protection film on the first conductive layer and the step of patterning a second conductive layer is preceded by the step of forming a second protection film on sidewalls of the floating gate electrode mask. The step of forming a first electrically insulating layer is also preferably preceded by the step of wet etching the floating gate electrode mask and the first and second protection films to expose the U-shaped floating gate electrode. Here, the step of etching the first and second protection films is preferably performed using an etchant that will not degrade the electrical characteristics of the floating gate electrode.

BRIEF DESCRIPTION OF THE DRAWINGS

FIGS. 8A–14A are cross-sectional views of intermediate structures that illustrate methods of forming the EEPROM device of FIG. 7A, according to a first embodiment of the present invention.

FIGS. 8B–14B are cross-sectional views of intermediate structures that illustrate methods of forming the EEPROM device of FIG. 7B, according to first embodiment of the present invention.

FIGS. 15A–16A are cross-sectional views of intermediate structures that illustrate methods of forming the EEPROM device of FIG. 7A, according to a second embodiment of the present invention.

FIGS. 15B–16B are cross-sectional views of intermediate structures that illustrate methods of forming the EEPROM device of FIG. 7B, according to a second embodiment of the present invention.

FIGS. 17A–22A are cross-sectional views of intermediate structures that illustrate methods of forming the EEPROM device of FIG. 7A, according to a third embodiment of the present invention.

FIGS. 17B–22B are cross-sectional views of intermediate structures that illustrate methods of forming the EEPROM device of FIG. 7B, according to a third embodiment of the present invention.

DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. It will also be understood that when a layer is referred to as being "on" another layer or substrate, it can be directly on the other layer or substrate, or intervening layers may also be present. Like numbers refer to like elements throughout.

Figure 7A:
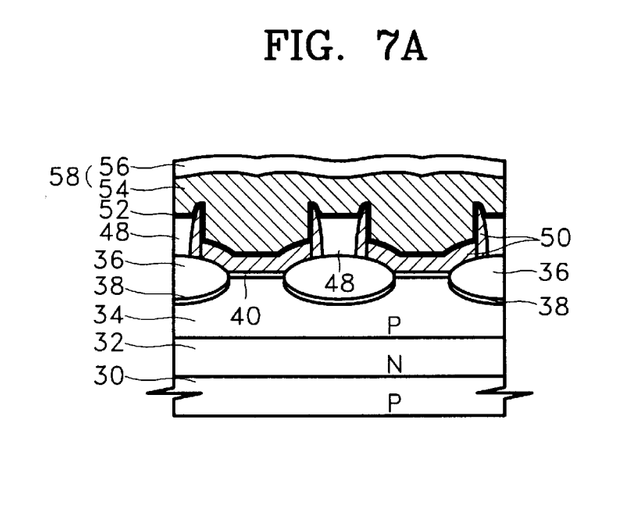
FIGS. 7A–7B are cross-sectional views of an EEPROM device according to the present invention, taken along the word line and bit line direction, respectively.
Figure 7B:
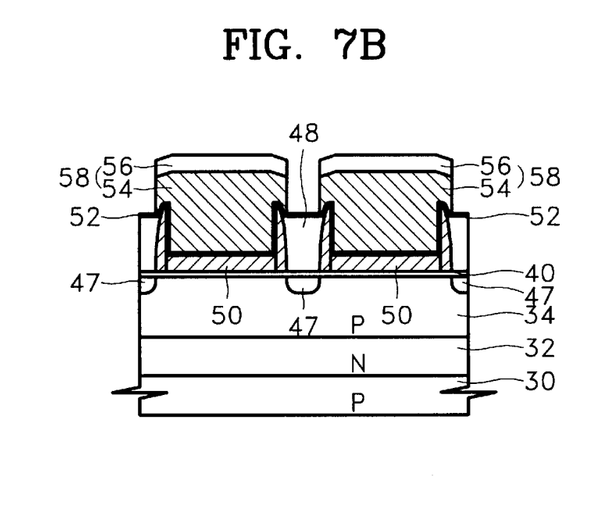

FIGS. 7A and 7B are sectional views of a nonvolatile memory device manufactured according to a first embodiment of the present invention, in which FIG. 7A is a sectional view taken along a word line direction, and FIG. 7B is a sectional view taken along a bit line direction. The nonvolatile memory device manufactured according to a first embodiment of the present invention includes a tunnel oxide layer 40, floating gates 50 formed on the tunnel oxide layer 40 and whose sections are concave in every direction, a buried layer 48 formed of an insulation material for filling the space between floating gates 50, an interlayer insulation film 52 covering the surfaces of the floating gates 50 and buried layer 48, and a control gate 58 formed on the interlayer insulating film 52. At this time, the floating gate 50 is disposed so as to be isolated by each unit cell at the place where the word line, i.e., the control gate 58, and the bit line are overlapped, and the control gate 58 is structured so that a polysilicon layer 54 and a silicide layer 56 are stacked as a composite layer to improve conductivity.

Therefore, according to the present invention, the first floating gate 50 is formed in a concave shape so that the inner sidewalls of the grooved portion thereof are capacitively coupled to the control gate 58. Thus, the capacitance between the floating gate 50 and the control gate 58 is greater than that of the conventional art, thereby improving the coupling ratio. The isolation burden on a field region can also be reduced because the voltage applied to the control gate 58 during programming operations can be lowered. Second, the isolation characteristics between active regions can be strengthened by forming the buried layer 48 made of an isolation material of a predetermined thickness on the isolation layer 36. Particularly, since the coupling ratio is improved by increasing the height of the sidewalls of the concave floating gate 50, the isolation burden on the field region can be reduced more than in the conventional art.

FIGS. 8 through 14 are sectional views showing a sequence of steps for manufacturing the nonvolatile memory device according to the first embodiment of the present invention, in which the "A" drawings are sectional views taken in a word line direction, and the "B" drawings are sectional views taken in a bit line direction.

Figure 8A:
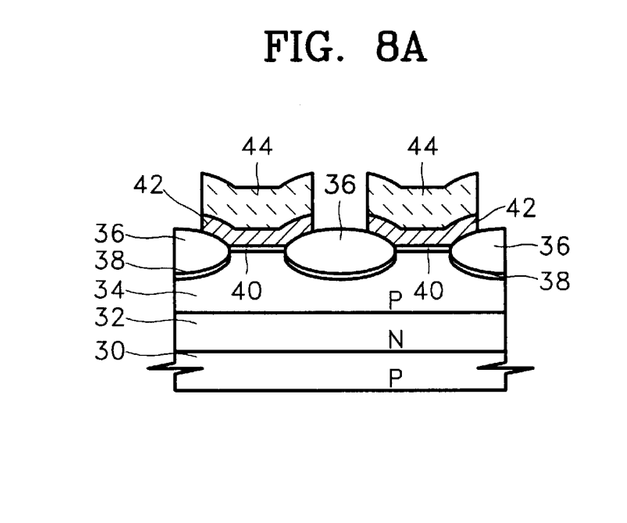
Figure 8B:
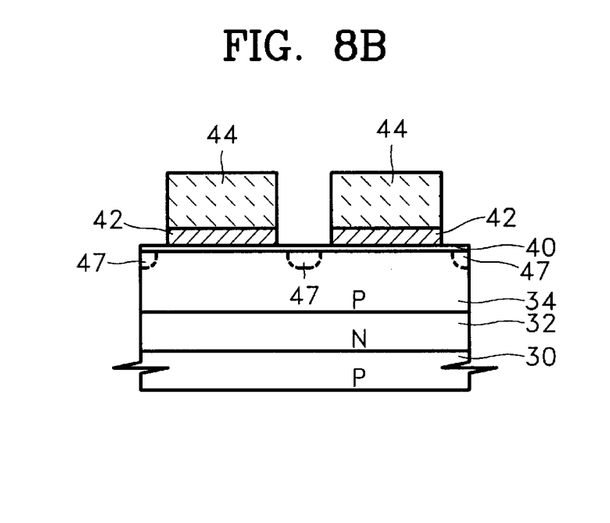

First, referring to FIGS. 8A and 8B, an N-type well 32 and a P-type well 34 are sequentially formed on a P-type semiconductor substrate 30 using photolithography, ion implantation and high-temperature heat treatment steps known to those skilled in the art. Then, in order to enhance the isolation characteristics between devices, after an implantation layer (not shown) for forming a channel stop layer is formed by ion-implanting a high-concentration of P-type impurities such as boron (B) ions into the isolation region of the semiconductor substrate, a field oxide isolation film 36 is formed to a thickness of 3,000 Å–4,000 Å using an isolation method such as LOCOS. In this case, the implantation layer is diffused into the semiconductor substrate by the heat supplied during the formation of the isolation film 36 to form the channel stop layer 38 under the isolation film 36.

Subsequently, the films used in forming the isolation film 36 are removed and then an oxide film or an oxynitride film is deposited on the entire surface of the exposed semiconductor substrate to a thickness of about 70 Å–100 Å to form a tunnel oxide film 40, and then a polysilicon film is deposited thereon to a thickness of 1,000 Å–3,000 Å using a chemical vapor deposition (CVD) method. Thereafter, impurity ions are doped into the polysilicon film by depositing phosphoryl chloride ($POCl_3$) containing a large dose of phosphorus, thereby forming a conductive layer to be patterned as a plurality of floating gates.

Next, a material having a good etching selectivity in relation to the conductive layer for the floating gate, e.g., nitride, is formed on the conductive layer to a thickness of 3,000 Å–5,000 Å and is patterned in a rectangular shape to be defined in each unit cell, thereby forming a first pattern 44. Then, the conductive layer is etched to form a rectangular conductive pattern 42 for a floating gate. Here, the channel stop layer 38 may be formed by implanting impurity ions having enough energy to penetrate the isolation film 36 after formation thereof. Also, the step of doping impurities into the polysilicon film may be performed by directly implanting phosphorus (P) or arsenic (As) ions into the polysilicon film as well as by depositing phosphoryl chloride.

Figure 9A:
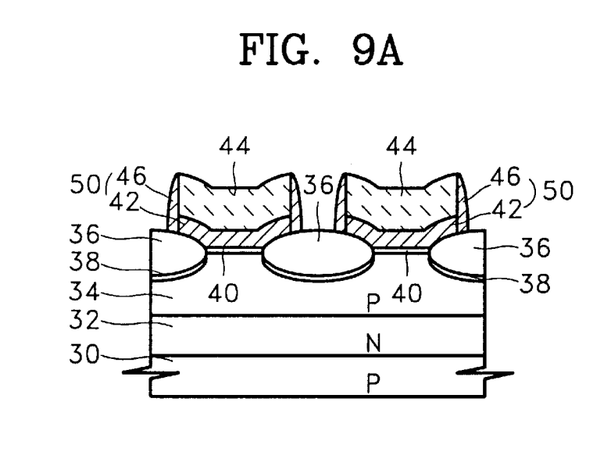
Figure 9B:
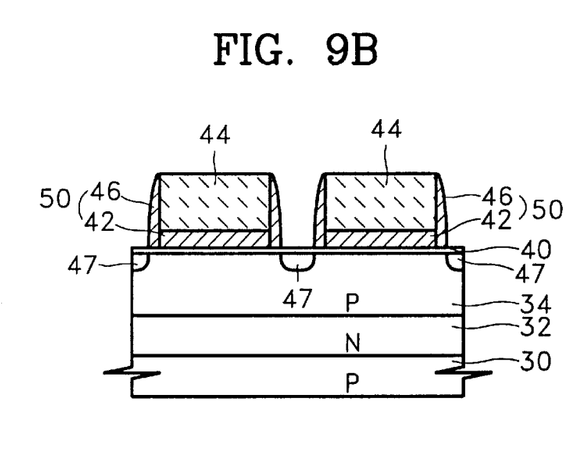

Referring to FIGS. 9A and 9B, a polysilicon film is formed to a thickness of about 1,000 Å–2,000 Å on the entire surface of the resultant structure having the first pattern 44, and then anisotropically etched until the isolation film 36 and the first pattern 44 are exposed, thereby forming a conductive spacer 46 for forming a floating gate on the sidewalls of the first pattern 44. The conductive pattern 42 for the floating gate and the conductive spacer 46 are electrically connected to each other to form the floating gate 50. In this case, the floating gate 50 is formed to have a concave section as viewed in both the word line direction and the bit line direction.

Subsequently, a source and drain 47 are formed in the semiconductor substrate by implanting N-type impurity ions. However, impurities may also be implanted by direct ion implantation of phosphorus or arsenic ions into the semiconductor substrate prior to forming the conductive spacer 46, as shown in FIG. 8 by the dotted line.

Figure 10A:
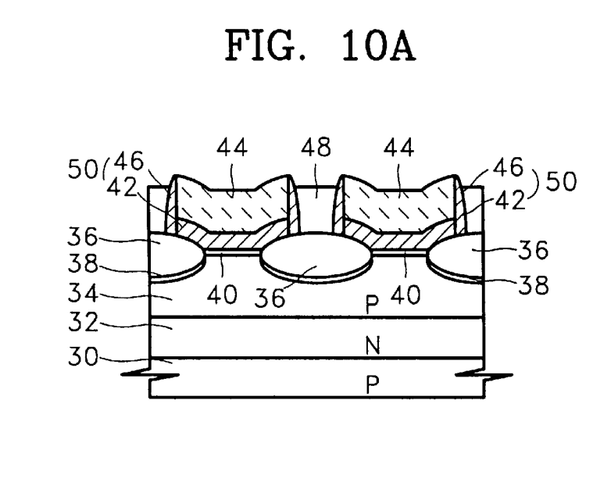
Figure 10B:
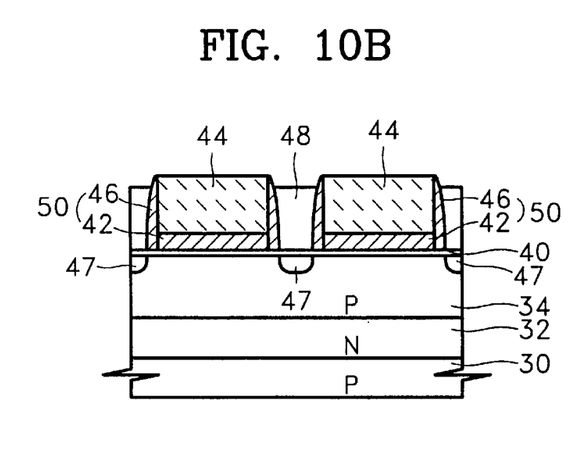

Referring to FIGS. 10A and 10B, a material having a good etching selectivity in relation to the first pattern 44, e.g., oxide, is deposited to a thickness of about 4,000 Å–6,000 Å on the entire surface of the resultant structure on which the floating gate 50 is formed using a CVD method, and then etched until the surface of the first pattern 44 is completely exposed, thereby forming a buried layer 48 which fills the space between the floating gates 50. The deposition thickness of the oxide can be controlled according to the width of the space between the floating gates 50, and it is preferable to deposit a thick oxide so as to completely fill the space between the floating gates 50.

Figure 11A:
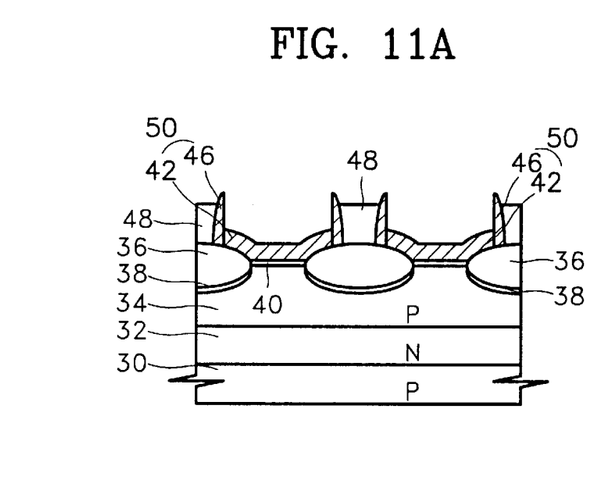
Figure 11B:
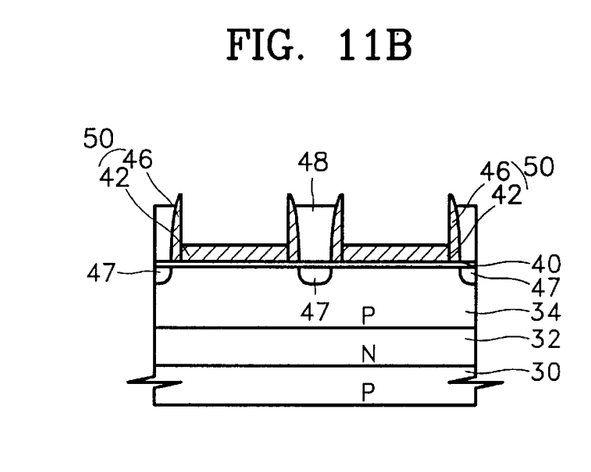
Figure 12A:
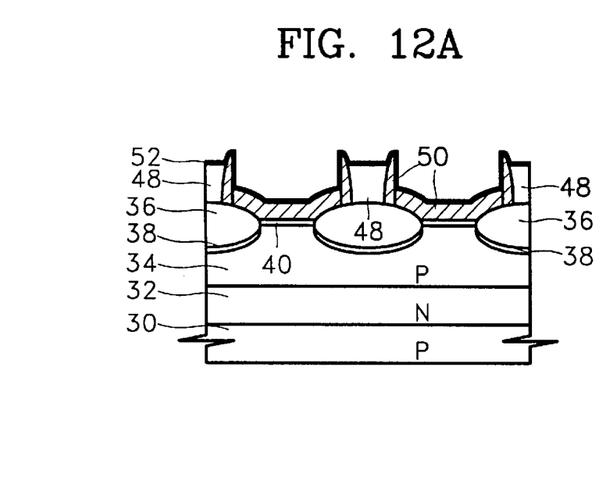
Figure 12B:
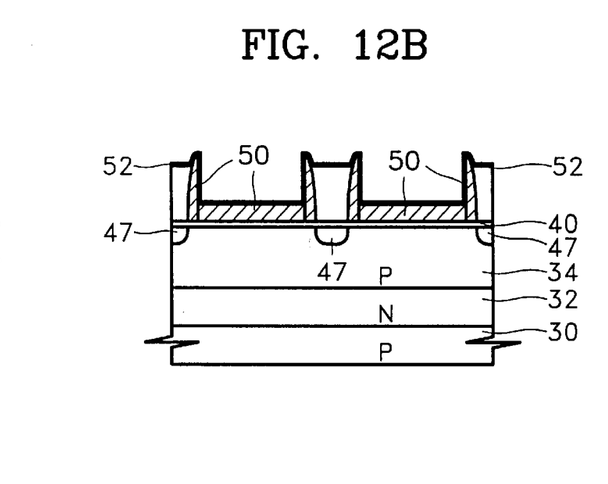

FIGS. 11A and 11B are sectional views of the memory device after the first pattern (44 of FIG. 10) has been removed by a wet etching method. Here, the sidewalls of the concave floating gate 50 are all exposed by the wet etching method. Referring to FIGS. 12A and 12B, a thermal oxide film having a thickness of about 80 Å and a nitride film having a thickness of about 100 Å–200 Å are deposited on the surface of the exposed floating gate 50 and that of the buried layer 48. Then, the surface of the nitride film is thermally oxidized to form an interlayer insulation film 52 having an equivalent oxide thickness of 150 Å–200 Å.

Figure 13A:
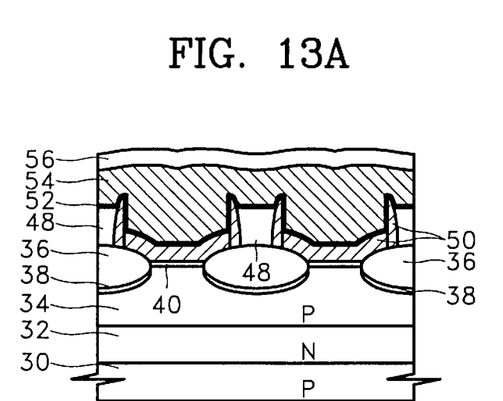
Figure 13B:
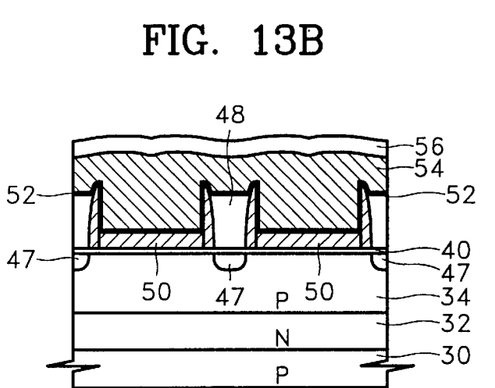

Referring to FIGS. 13A and 13B, a polysilicon film 54 is deposited on the interlayer insulation film to a thickness of about 2,000 Å–3,000 Å using a CVD method, and then a highly conductive metal silicide layer 56 is deposited thereon to a thickness of about 1,000 Å–2,000 Å. At this time, dopants may also be implanted into the polysilicon film 54 to increase the conductivity thereof.

Figure 14A:
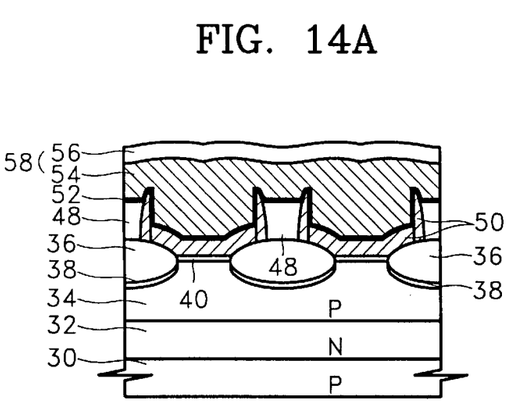
Figure 14B:
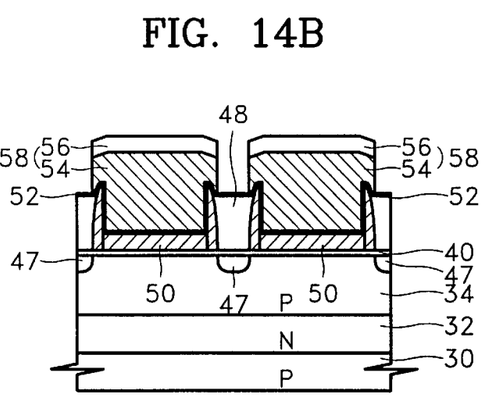

Referring to FIGS. 14A and 14B, the polysilicon film 54 and silicide layer 56 are patterned through a photolithography process to form a control gate 58 having an extended bar shape which overlaps the floating gates 50 of the respective cells in a word line direction (see FIG. 14A) and which is shaped such that it is separated from adjacent control gates 58 in a bit line direction (see FIG. 14B).

Figure 15A:
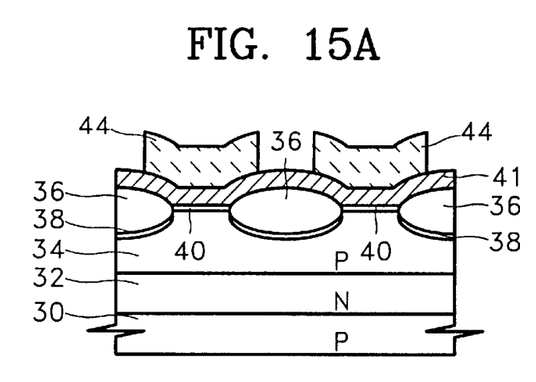
Figure 15B:
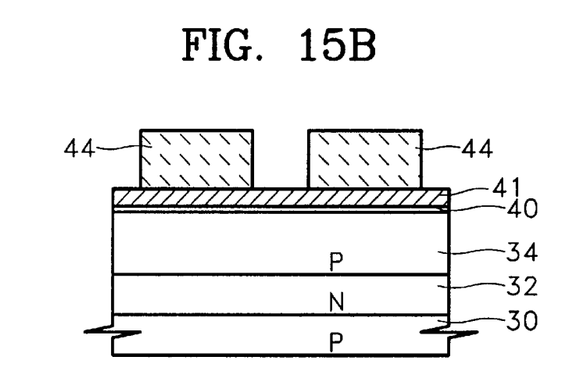
Figure 16A:
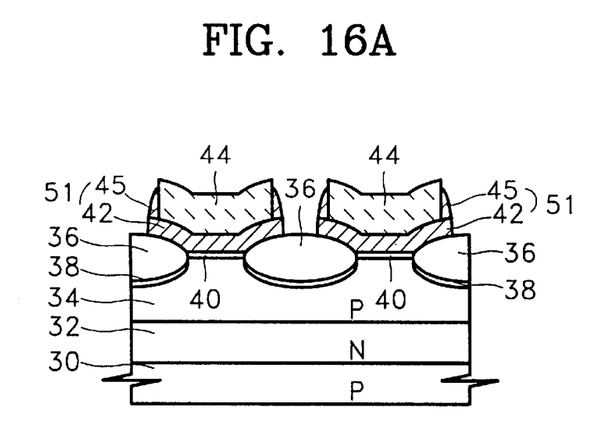
Figure 16B:
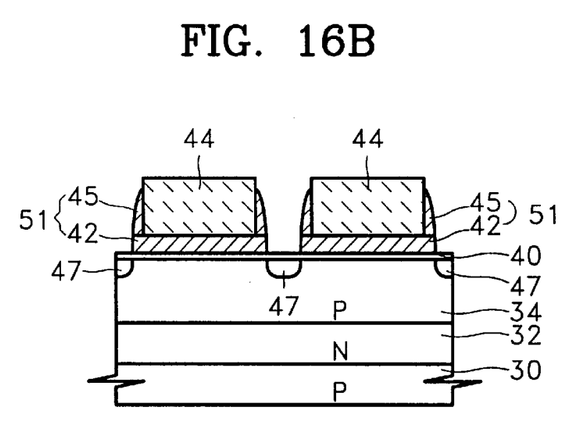
Figure 17A:
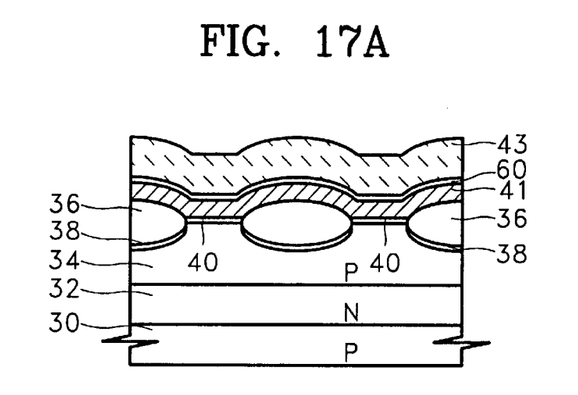
Figure 17B:
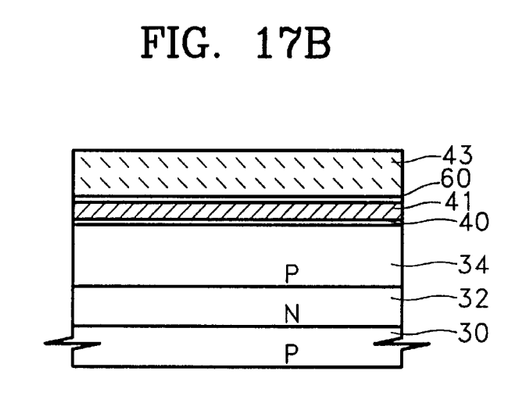

FIGS. 15A–15B and 16A–16B are sectional views showing a sequence of steps for manufacturing a nonvolatile memory device according to a second embodiment of the present invention, in which like reference numerals are used for designating like or equivalent portions as those in FIGS. 8 through 14. Referring now to FIGS. 15A–15B, a conductive layer 41 for a floating gate is formed using the technique described in FIGS. 8A–8B, and then a material having a good etching selectivity in relation to the conductive layer 41, e.g., a nitride, is deposited on the conductive layer 41 to a thickness of about 3,000 Å–5,000 Å and the resultant structure is patterned in a rectangular shape to define each cell, thereby forming a first pattern 44. Subsequently, a polysilicon film is deposited on the entire surface of the resultant structure having the first pattern 44 formed thereon to a thickness of about 1,000 Å–2,000 Å using the CVD method to form a conductive layer for forming conductive spacers. Then, as illustrated by FIGS. 16A–16B, the conductive layer forming conductive spacers and that for a floating gate are anisotropicaly etched until the isolation film 36 and the first pattern 44 are exposed, thereby forming a floating gate 51 comprised of a rectangular conductive pattern 42 for a floating gate and a cylindrical conductive spacer 45 having a concave section in both the word line and bit line direction formed on the sidewalls of the first pattern 44 and connected to the conductive pattern 42.

Next, N-type impurity ions are injected, thereby forming source and drain regions 47 as illustrated best by FIG. 16B. Thereafter, the steps of forming a buried layer, an interlayer dielectric film, and a control gate are the same as those described in FIGS. 10 through 14.

FIGS. 17–22 are sectional views showing a sequence of steps for manufacturing the nonvolatile memory device according to a third embodiment of the present invention in which like reference numerals are used for designating like or equivalent portions in FIGS. 8 through 14. Referring to FIGS. 17A and 17B, after the conductive layer 41 for a floating gate is formed as described in FIG. 8, a material having a good etching selectivity in relation to the conductive layer 41 or a first pattern forming film to be formed later, e.g., an oxide, is deposited to a thickness of 200 Å–500 Å on the conductive layer 41 using the CVD method to form a first protection film 60. Then, a material having a good etching selectivity in relation to the first protection film and a buried layer to be formed later, e.g., a nitride, is deposited on the first protection film 60 to a thickness of 3,000 Å–5,000 Å, thereby forming a first pattern forming film 43.

Figure 18A:
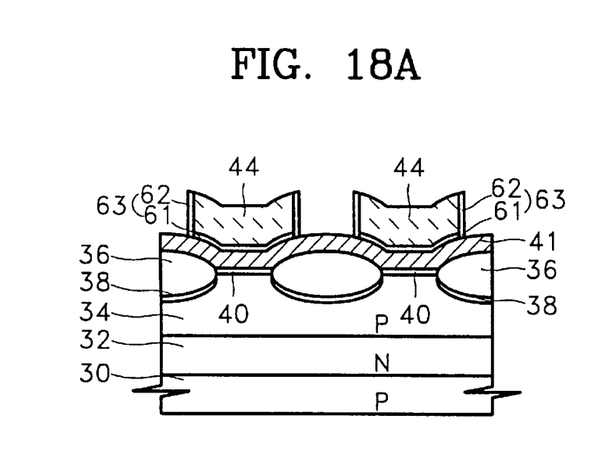
Figure 18B:
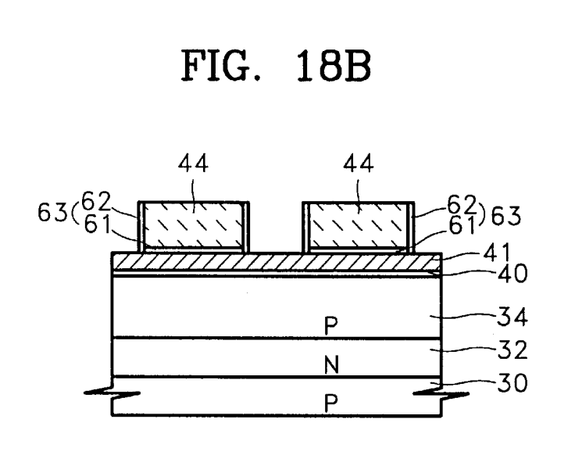

Referring to FIGS. 18A and 18B, the first pattern forming film 43 and the first protection film 60 are patterned so as to define each cell to form the rectangular first pattern 44 and first protection film pattern 61. The same material as the first protection film 60, e.g., an oxide, is then deposited using a CVD method to a thickness of 200 Å–500 Å on the entire surface of the resultant material having the first pattern 44 and the first protection film pattern 61 formed therein, to form a second protection film. Then, the second protection film is anisotropically etched to form a spacer 62 composed of the second protection film on the sidewall of the first pattern 44. In this case, the first protection film pattern 61 and the spacer 62 composed of the second protection film are commonly designated as a protection film 63.

Figure 19A:
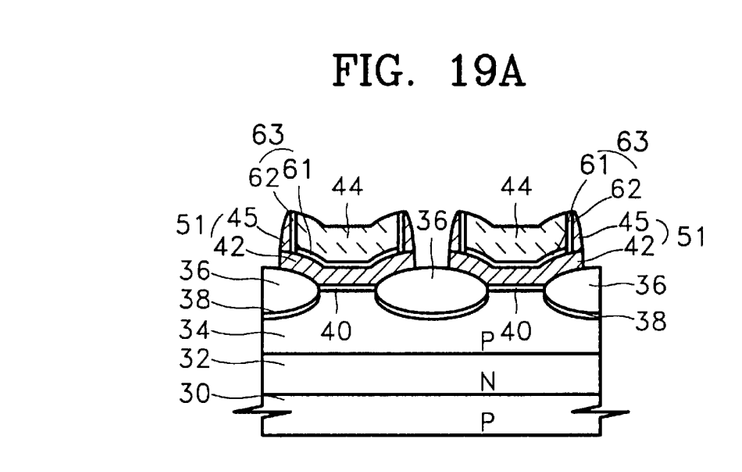
Figure 19B:
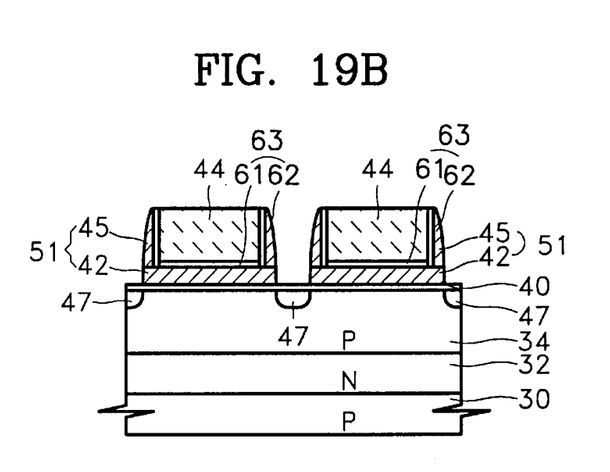

Referring to FIGS. 19A and 19B, by a CVD method, a polysilicon film is deposited to a thickness of 1,000 Å–2,000 Å on the entire surface of the resultant structure having the first pattern 44 and the first protection film 63 formed thereon to form a conductive layer for forming a conductive spacer. Thereafter, the conductive layer for forming the conductive spacer and that for the floating gate are anisotropically etched until the isolation film 36 and the first pattern 44 are exposed. Subsequently, source and drain regions 47 are formed on the exposed semiconductor substrate by implanting N-type impurity ions into the substrate.

Figure 20A:
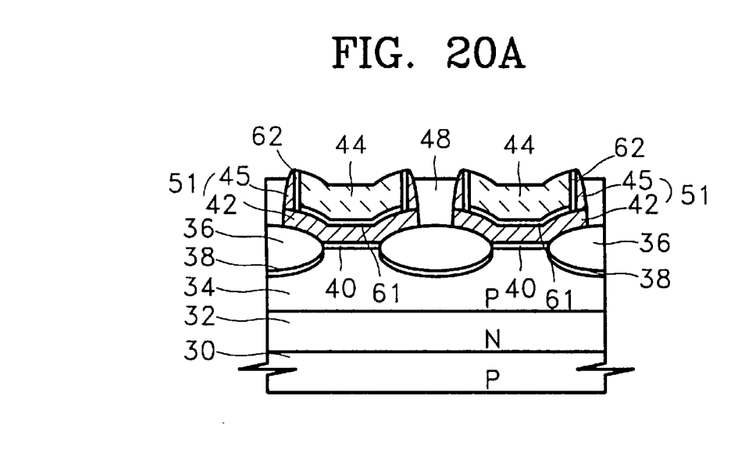
Figure 20B:
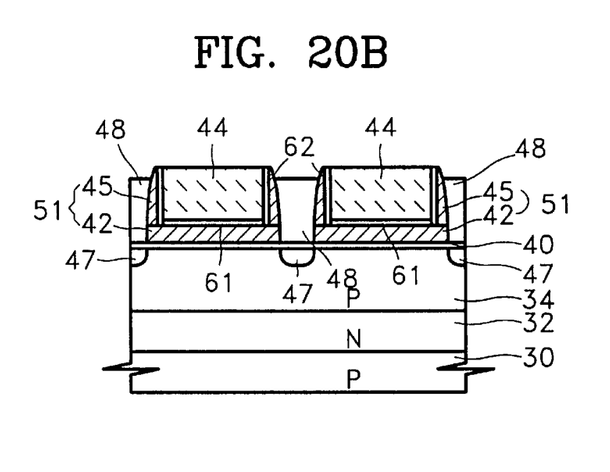

Referring to FIGS. 20A and 20B, a material having a good etching selectivity in relation to the first pattern, e.g., an oxide, is deposited to a thickness of 4,000 Å–6,000 Å on the entire surface of the resultant structure having the floating gate 51 formed thereon using the CVD method and then etched until the surface of the first pattern 44 is completely exposed, thereby forming a buried layer 48 for completely filling the space between the floating gates 51. In this case, the deposition thickness of the oxide is controlled according to the width of the space between the floating gates 51. It is preferred that the space between the floating gates 51 is completely filled.

Figure 21A:
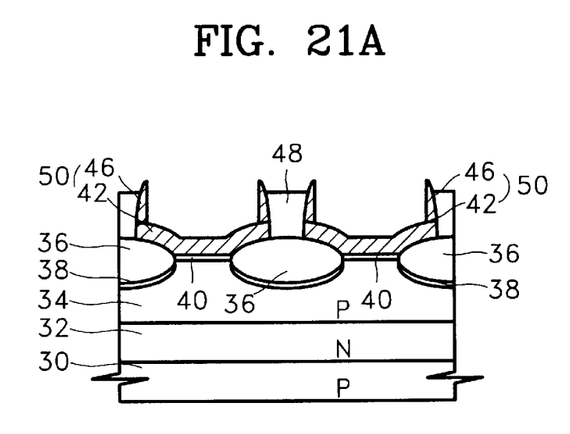
Figure 21B:
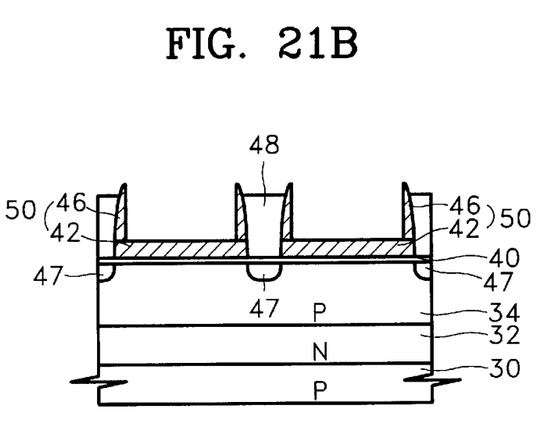

FIGS. 21A and 21B are sectional views obtained by removing the first pattern (44 of FIGS. 20A and 20B) using a wet-etching method and then removing the protection film (63 of FIGS. 20A and 20B) through a wet-etching process in which the sidewalls of the concave floating gate 51 are exposed in every direction.

The first pattern is generally removed using a wet-etching solution such as phosphoric acid. However, during such a wet-etching process, the floating gate 50 is exposed to the wet-etching solution so that the surface thereof may be damaged or the edges of the first pattern are not completely removed which degrades the film quality. As a result, when a high voltage is applied during a programming or erasing operations, leakage current may occur. Therefore, in this embodiment, a protection film 63 is formed in every direction on the sidewalls of the floating gate 50 to protect the floating gate 50 during removal of the first pattern, so that the leakage current does not occur. The protection film 63 is then removed using a wet etchant which preferably does not damage the floating gate.

Figure 22A:
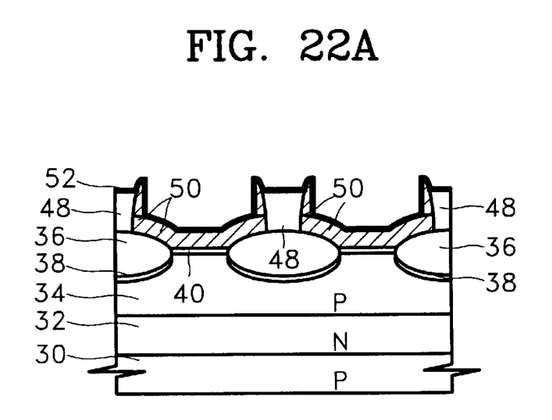
Figure 22B:
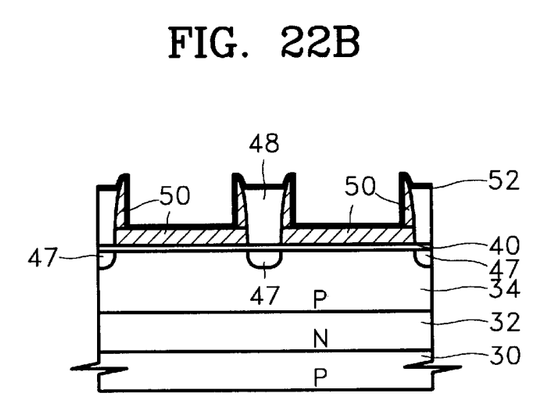

Referring to FIGS. 22A and 22B, a 80 Å thick thermal oxide film and a 100 Å–200 Å thick nitride film are then deposited on the surfaces of the exposed floating gate 50 and the buried layer 48, and then the surface of the nitride film is thermally oxidized to form an interlayer dielectric film 52 having a thickness of about 150 Å–200 Å.

The nonvolatile memory device according to the present invention and manufacturing method therefor have the following advantages. First, a floating gate is formed to have a concave section, thereby increasing the capacitance between a control gate and the floating gate, i.e., increasing the coupling ratio. Accordingly, the voltage applied for a programming or erasing operation can be lowered to alleviate the isolation burden on a field region. If the programming or erasing voltage is lowered, the operating voltages of transistors and capacitors constituting logic circuits for generating the programming voltage or transmitting the generated programming voltage to the control gate of a cell are also decreased, thereby improving a breakdown voltage of a transistor gate oxide film or capacitor oxide film, or a junction breakdown voltage of the transistors.

Second, the space between floating gates is filled with an insulating buried layer to thicken the isolation film for cell-to-cell isolation, thereby strengthening the isolation characteristics of a field region. In other words, although only the isolation film is used conventionally for isolation between active regions, the buried layer as well as the isolation film are used in the present invention. As a result, an isolation film having an increased effective thickness for cell-to-cell isolation can be obtained in the present invention. Such an isolation film thickness increasing effect allows the field region to be scaled down, thereby decreasing the overall area of a cell array, which increases the integration level of the device.

Third, since the control gate is formed after completely forming the floating gate, conductive residues do not remain in the isolation film, which is a serious problem in conventional self-alignment etching processes. Thus, device inferiority can be prevented. Fourth, in order to control the thickness of a first pattern, the capacitance between the floating gate and control gate is increased, thereby effectively increasing the coupling ratio.

In the drawings and specificaton, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming a non-volatile memory device, comprising the steps of:

forming first and second floating gate electrodes having U-shaped cross-sections, at spaced apart locations on a substrate;

forming an electrically insulating layer on the first and second floating gate electrodes and in a space extending therebetween;

etching back the electrically insulating layer to expose the first and second floating gate electrodes and define a buried electrically insulating region extending in the space between the first and second floating gate electrodes;

forming an interlayer insulating layer on the first and second floating gate electrodes and on the buried electrically insulating region; and forming a control gate on the interlayer insulating layer, opposite the first and second floating gate electrodes.

2. A method of forming a non-volatile memory device, comprising the steps of:

forming a field oxide isolation region on inactive portions of a semiconductor substrate;

forming a tunneling oxide layer on active portions of the semiconductor substrate;

forming a first electrically conductive layer on the tunneling oxide layer;

forming a floating gate electrode mask on the first electrically conductive layer, opposite the tunneling oxide layer;

forming a second electrically conductive layer on sidewalls of the floating gate electrode mask and in electrical contact with the first electrically conductive layer;

patterning the second electrically conductive layer to define a U-shape floating gate electrode comprising portions of the first and second electrically conductive layers;

forming an electrically insulating layer on the U-shaped floating gate electrode and on the field oxide isolation region;

etching back the electrically insulating layer to define a buried electrically insulating region on the field oxide isolation region and expose the floating gate electrode mask;

removing the floating gate electrode mask;

forming an interlayer insulating layer on the U-shaped floating gate electrode and on the buried electrically insulating region; and forming a control gate on the interlayer insulating layer, opposite the U-shaped floating gate electrode.

3. The method of claim 2, wherein said step of forming an electrically insulating layer on the U-shaped floating gate electrode is preceded by the step of implanting source and drain region dopants through the tunneling oxide layer, using the U-shaped floating gate electrode as an implant mask.

4. The method of claim 2, wherein said step of patterning the second electrically conductive layer comprises etching the second electrically conductive layer to expose the field oxide isolation region and the tunneling oxide layer.

5. The method of claim 4, wherein said step of forming an electrically insulating layer on the U-shaped floating gate electrode and on the field oxide isolation region comprises forming an electrically insulating layer on the U-shaped floating gate electrode, the field oxide isolation region and the tunneling oxide layer; and wherein said step of etching back the electrically insulating layer comprises etching back the electrically insulating layer to define a buried electrically insulating region that extends on the field oxide isolation region and the tunneling oxide layer.

6. A method of forming an EEPROM memory device, comprising the steps of:

forming a field oxide isolation region on inactive portions of a semiconductor substrate;

forming a tunneling oxide layer having a thickness in a range between about 70 Å and 100 Å on active portions of the semiconductor substrate;

depositing a first polysilicon layer having a thickness in a range between about 1000 Å and 3000 Å on the tunneling oxide layer;

forming a floating gate electrode mask comprising silicon nitride on the first polysilicon layer, opposite the tunneling oxide layer;

depositing a second polysilicon layer having a thickness in a range between about 1000 Å and 2000 Å on the first polysilicon layer and on sidewalls of the floating gate electrode mask;

anisotropically etching the second polysilicon layer and the first polysilicon layer to expose the field oxide isolation region and define a U-shaped floating gate electrode;

depositing an electrically insulating layer on the floating gate electrode mask and on the field oxide isolation region;

etching back the electrically insulating layer to define a buried electrically insulating region on the field oxide isolation region and expose the floating gate electrode mask;

removing the floating gate electrode mask to expose the U-shaped floating gate electrode;

forming an interlayer insulating layer on the U-shaped floating gate electrode and on the buried electrically insulating region; and forming a control gate on the interlayer insulating layer, opposite the U-shaped floating gate electrode.

7. The method of claim 6, wherein said step of depositing an electrically insulating layer is preceded by the step of implanting source and drain region dopants through the tunneling oxide layer, using the U-shaped floating gate electrode as an implant mask.

8. The method of claim 6, wherein said anisotropic etching step comprises anisotropically etching the second polysilicon layer and the first polysilicon layer to expose the field oxide isolation region and the tunneling oxide layer and define a U-shaped floating gate electrode.

* * * * *